(12) United States Patent
Muray et al.

(10) Patent No.: US 8,003,952 B2
(45) Date of Patent: Aug. 23, 2011

(54) INTEGRATED DEFLECTORS FOR BEAM ALIGNMENT AND BLANKING IN CHARGED PARTICLE COLUMNS

(75) Inventors: Lawrence P. Muray, Moraga, CA (US); James Spallas, Alamo, CA (US); Charles Silver, Richmond, CA (US)

(73) Assignee: Agilent Technologies, Inc., Leveland, CO (US)

( * ) Notice: Subject to any disclaimer, the term of this patent is extended or adjusted under 35 U.S.C. 154(b) by 259 days.

(21) Appl. No.: 11/848,226

(22) Filed: Aug. 30, 2007

(65) Prior Publication Data
US 2008/0217531 A1 Sep. 11, 2008

Related U.S. Application Data

(60) Provisional application No. 60/825,404, filed on Sep. 12, 2006.

(51) Int. Cl.
*H01J 37/06* (2006.01)
*H01J 37/12* (2006.01)
(52) U.S. Cl. ............ 250/396 R; 250/396 ML; 250/397; 250/398; 250/491.1; 250/492.1; 250/492.2; 250/492.22

(58) Field of Classification Search .............. 250/396 R, 250/396 ML, 397, 398, 492.1, 492.2, 492.22, 250/491.1
See application file for complete search history.

(56) References Cited

U.S. PATENT DOCUMENTS

| 5,122,663 | A | 6/1992 | Chang et al. |
| 5,155,412 | A | 10/1992 | Chang et al. |
| 5,585,629 | A | 12/1996 | Doran et al. |
| 6,130,429 | A * | 10/2000 | Ambe et al. ............ 250/310 |
| 6,288,401 | B1 | 9/2001 | Chang et al. |
| 7,109,486 | B1 | 9/2006 | Spallas et al. |
| 7,394,071 | B2 * | 7/2008 | Kim et al. ............ 250/311 |

FOREIGN PATENT DOCUMENTS
WO 2006/004374 A1 1/2006

OTHER PUBLICATIONS

L.P. Muray et al. "Advances in Arrayed Microcolumn Lithography," J. Vac. Sci. Technol. B, vol. 18, No. 6, Nov./Dec. 2000.
T.H.P. Chang et al. "Multiple Electron-Beam Lithography," Microelectronic Engineering 57-58 (2001) pp. 117-135.

* cited by examiner

*Primary Examiner* — David A Vanore

(57) ABSTRACT

A charged particle beam column package includes an assembly (e.g., comprising a plurality of layers, which can have a component coupled to one of the layers), and at least one deflector between an extractor and aperture of the assembly. Further, at least one of the layers has interconnects thereon.

16 Claims, 4 Drawing Sheets

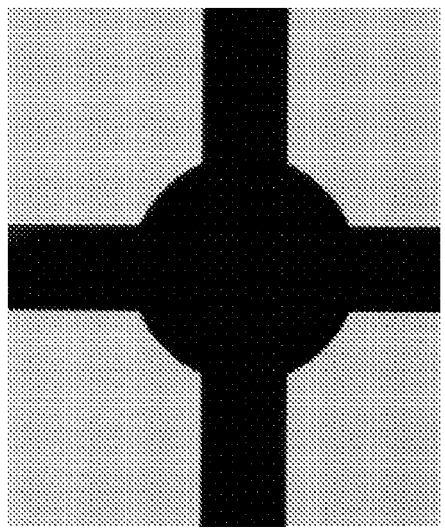
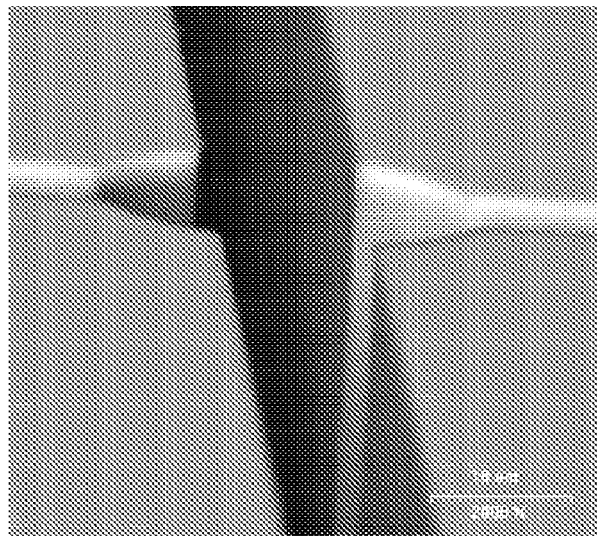
FIG. 5A  FIG. 5B
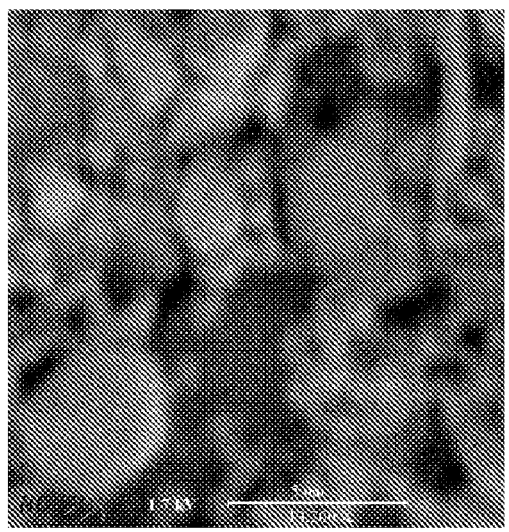
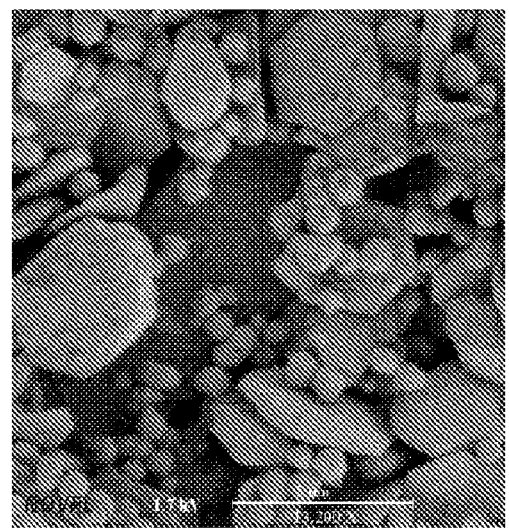
FIG. 6A  FIG. 6B

INTEGRATED DEFLECTORS FOR BEAM ALIGNMENT AND BLANKING IN CHARGED PARTICLE COLUMNS

PRIORITY REFERENCE TO PRIOR APPLICATIONS

This application claims benefit of and incorporates by reference U.S. patent application Ser. No. 60/825,404, entitled "Integrated Deflectors for Beam Alignment and Blanking in Miniature Columns," filed on Sep. 12, 2006, by inventors Lawrence Muray et al.

TECHNICAL FIELD

This invention relates generally to scanning electron microscopes (SEMs), and more particularly, but not exclusively, provides an apparatus and method for steering charged particle beams in an SEM column (e.g., in miniature, table top, portable SEMs, etc.).

BACKGROUND

Miniature electron or ion beam columns offer many advantages over conventionally built electron or ion columns in terms of simplicity, footprint, and cost. Scaling the electron optical components of electrostatic lens systems reduces lens aberrations roughly linearly with scale factor resulting in spot-size and beam current comparable to high-end conventional magnetic lenses. Challenges in fabrication have been mostly overcome by careful engineering and deep silicon etching techniques which meet or exceed circularity and sidewall roughness tolerances. Likewise, column alignment, especially lens-to-lens or lens-to-limiting aperture requirements can be met by suitably placed registration marks and new generations of pick-and-place tools.

A remaining difficulty with miniature columns, however, is the physical alignment of the electron/ion source optical axis to the extraction electrode, the limiting aperture and other column elements. Unlike conventional systems, in which the bore diameter of the extractor and the distance from source to extractor is substantially larger than the mechanical alignment tolerance of the source, miniature columns require alignment accuracy on the micron scale. Even thermal-induced motion of the tip from normal heating during operation can cause shifts that significantly degrade performance or prevent column operation altogether. Previous solutions have relied on in-situ mechanical alignment of the tip with a two or more axis ultra-high vacuum compatible stage or flexure. While successful in some circumstances, this approach is expensive, unreliable, and bulky.

Accordingly, a new apparatus and method are needed for alignment of charged particle beams.

SUMMARY

Embodiments of the invention overcome the limitations of mechanical source alignment by incorporating one or more electrostatic deflectors into the column source stack. Depending on the number and location of the deflectors, the beam can be aligned to the optic axis of any column element as well as overcome manufacturing errors in column to final lens alignment. In addition the source deflectors can provide primary blanking and secondary blanking functions, as well as in a suitable configurations, enable symmetric differential blanking signals for GHz electronics. The microfabricated components and the high-density interconnection capabilities of the miniature columns provide the ideal platform to incorporate one or more of these deflectors in a straightforward manner.

A miniature SEM, according to an embodiment of the invention, comprises a low-voltage, all electrostatic, microfabricated electron beam column assembled from bonded stacks of silicon chips and glass insulators. The components are generally microfabricated using bulk silicon micromachining techniques and precisely aligned and packaged. The small bore diameters, small spacings and small working distance allow the performance of the miniature columns to approach that of the high-end magnetic lens e-beam systems.

The small size, process compatibility, and high-performance of all-electrostatic, microfabricated deflectors make these devices well suited for integration with miniature SEMs. Previously in miniature columns, the deflectors have been used exclusively for deflection of the beam over a substrate for imaging or lithography purposes. Embodiments of the invention include one or more deflectors (multipole, such as quadrapole, for example) placed higher up in the column (e.g., closer to the electron/ion source) which can serve to align the optic axis of the source to the column and final lens, as well as, function as the primary and secondary blanker plates in the miniature columns. Other functions of these deflectors can include, but are not limited to, compensation for manufacturing related misalignment of the column components, beam shaping components (e.g. shaped beam system) and true differentially driven blanker elements.

The basic equation governing deflection of a charged particle is:

$$y = D \times \frac{l}{d} \times \frac{V_p}{V_{el}}$$

where y is the deflection at the plane, D is the separation of the plane and the center of the deflection plates, d is the separation of the deflector plates, l is the length of the deflector plates, $V_p$ is the voltage applied (+ and −) to the plates and $V_{el}$ is the primary beam energy. Typical values for the geometries in miniature electron columns deflect the beam ~10 um at 5V, in the plane of limiting aperture.

In an embodiment of the invention, a charged particle beam column package comprises an assembly and at least one deflector between an extractor and a limiting aperture of the assembly (e.g., anywhere above the limiting aperture including directly beneath the extractor).

In an embodiment of the invention, a method comprises: generating a charged particle beam; focusing the beam with a charged particle beam column, the beam column package having an assembly and at least one deflector between an extractor and a limiting aperture of the assembly (e.g., anywhere above the limiting aperture including directly beneath the extractor); deflecting the beam using the at least one deflector; scanning the beam over a target; and detecting secondary electrons with the detector.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIGS. 5A and 5B are images of a deflector according to an embodiment of the invention;

FIGS. 6A and 6B are images with and without use of a deflector, respectively, of a sample.

DETAILED DESCRIPTION OF THE ILLUSTRATED EMBODIMENTS

The following description is provided to enable any person having ordinary skill in the art to make and use the invention, and is provided in the context of a particular application and its requirements. Various modifications to the embodiments will be readily apparent to those skilled in the art, and the principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
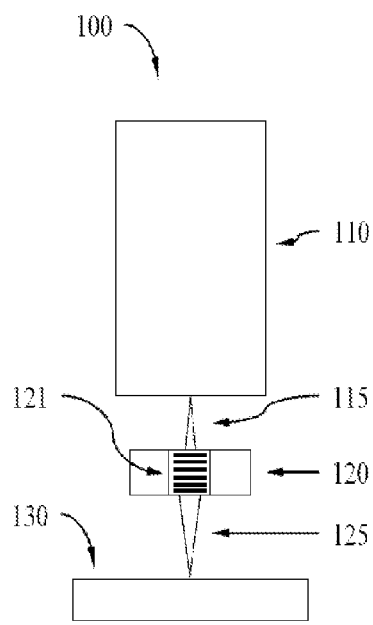
FIG. 1 is a block diagram illustrating an apparatus incorporating an charged particle column having a deflector according to an embodiment of the invention.

FIG. 1 is a block diagram illustrating an apparatus 100 incorporating, in this embodiment, a charged particle beam column package 120. In embodiments of the invention, the apparatus 100 includes scanning electron microscopes, lithography, inspection, and analysis tools. The apparatus 100 includes an electron source 110 (cathode), such as an thermal field emitter (TFE), positioned adjacent to a beam column package 120, which supports the lenses, deflectors, blankers, magnetic or electrostatic, and other elements required for the column operation (heretofore components 121). The package 120 and components 121 form the package assembly which is positioned adjacent to a sample holder 130. In an embodiment of the invention, the electron source 110 is positioned above the beam column package 120 and the sample holder 130 is positioned below the beam column package 120.

In an embodiment of the invention, the electron source 110 emits electrons 115 by field assisted thermionic emission. The electron source 110 can also comprise a Tungsten or $LaB_6$ filament, or any of a multitude of cold field emitters, including carbon nanotubes and microfabricated field emission tips. The electrons 115 can have an energy ranging from a few hundred eV to up to about 5 keV. The components 121 coupled to the beam column package 120 extract, collimate, and focus the electrons 115 into an electron beam 125, which is emitted from the package assembly as an electron beam 125. The package assembly scans the focused the beam 125 over the sample holder 130.

In an embodiment in which the apparatus 100 includes a scanning electron microscope, the sample holder 130 holds an object for imaging. The electron beam 125 strikes the object causing the emission of electrons. The detected electrons may include backscattered and secondary electrons. The detected electrons are then used to generate an image of the object. In an embodiment of the invention, a silicon drift detector (SDD) or other photon detector can be used in addition to the primary detector in order to detect photons. The detected photons are then used for materials identification and analysis.

Figure 2:
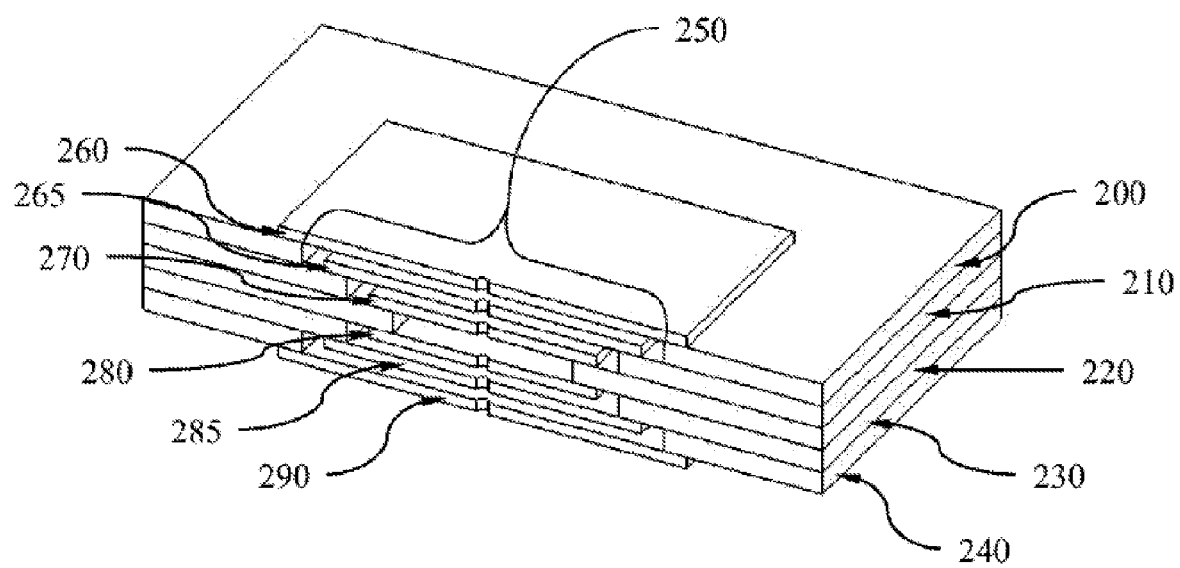
FIG. 2 is a block diagram illustrating a column of the apparatus of FIG. 1 in cross section having a deflector in the source stack.

FIG. 2 is a perspective view illustrating an electron beam column package 120 according to an embodiment of the invention. The beam column package 120 eliminates individually wired interconnects common to conventional scanning electron microscopes and lithography devices and replaces them with high density, batch-processed, printed circuitry. This is achieved using low temperature co-fired ceramic (LTCC) using, for example, materials from DuPont (e.g., 951 or 943) or Ferro (e.g., A6-S or A6-M), or high-temperature co-fired ceramic (HTCC) using, for example, materials from Kyocera, polyimide, or any other layering technology that produces a rigid package. The beam column package 120 is built layer-by-layer, up to 30 layers or more, and has interconnects strategically distributed on each layer using high-resolution pattern transfer, thereby yielding up to 60 surfaces or more for patterning and enabling the exposed surfaces to be reserved for termination pads for contact to flexible printed circuit (FlexPC) connectors or other high density interface. In contrast, miniature columns fabricated using alternative technologies have incorporated platforms or packages with significantly fewer surfaces for patterning.

Other advantages of using LTCC or HTCC technology include the ability to batch process and fabricate in high volume; fabrication at low cost packages with assembled components that can be 100% electrically tested before shipping and are extremely reliable; packages that provide a significant real estate for printed interconnects, ground planes, strip lines, embedded active and passive devices, external active and passive devices; and packages that allow GHz drivers to be placed close to the components 121. Further, the packages, e.g. LTCC, are ultrahigh vacuum compatible; rigid and durable; support low-loss high-speed interconnects (>1 GHz) by enabling printing strip-lines and micro-strip-lines; hermetically seal internal interconnections to prevent reliability failures and provide back to front vacuum isolation; support lithographically printed interconnections with good resolution and registration; offer sufficient real estate for redundancy, scaling, or the addition of electronics or either passive (e.g., resistors, capacitors) or active devices; and readily integrate with FlexPC connectors for simple interconnection to the column.

The beam column package 120 comprises five layers 200-240 stacked one on top of another and six components 260-290. Each layer can have one or more components coupled to it (one per side). In an embodiment of the invention, the component 260 is coupled to a top surface of the layer 200; component 265 is coupled to the top surface of the layer 210, components 270 and 280 are coupled to a top and a bottom surface, respectively, of the layer 220; the component 285 is coupled to a bottom surface of the layer 230; and the component 290 is coupled to a bottom surface of the layer 240. In an embodiment of the invention, the column package 120a can comprise a different number of layers and/or components. A component can include a single device like, for example, a silicon lens element, or a stack of devices like, for example, silicon lenses electrically isolated by an insulator like, for example, Pyrex. The number of devices in a stack not limited.

In an embodiment, component 260 includes an extractor, component 265 includes a deflector and component 270 includes a blanking aperture/limiting aperture. In an embodiment, the extractor, deflector and blanking aperture are combined into a single component located at or near the top of the package 120 (e.g., near the charged particle source). The deflector will be discussed in further detail below.

The top and bottom surface of the layers 200-240 are available for printed circuitry. Each electrical interconnect can be made to terminate at a pad on the top of the layer 200, the bottom of the layer 240, or any combination. Electrical connections between layers are made as needed by vias in the layers 200-240. Connection to external power supplies can be made using, for example, FlexPC connectors.

Pads can be printed on each layer 200-240 to allow each component 260-290 to be attached and electrically contacted using either manual techniques or production assembly techniques like, for example, a bump or ball bonding. Each component 260-290 of the column 120 is aligned and attached directly the column 120. The precise alignment needed can be done using marks printed on each component 260-290 and layer 200-240. The column 120 can have cutouts to view the marks and registration features during assembly to perform or verify alignment. Pads printed on of the topmost layer 200, bottommost layer 240, or on any other layer whereby a cutout is made to expose a surface can be used for attaching a FlexPC connector or other high density interface to the package using either manual techniques or production assembly techniques like, for example, a bump or ball bonding or soldering. Advantages of using this method may include: assembly is simpler, less labor intensive, more reliable that other techniques used including anodic bonding and epoxy. This is because LTCC is a mature technology that allows batch processing, printed interconnects, and 100% electrical and mechanical testing of the components and subassemblies. The assembly can be done in high volume production using a variety of techniques. There is no contamination or other reliability problem. Layered processing achieves smooth, flat, and parallel surfaces for component attachment. The layer thickness is very well controlled. Electrical connection to a large number of pads is possible. LTCC, HTCC, and other layered process are compatible with lapping and polishing processes which can be used to create packages with extreme parallelism (TTV), flatness, and smoothness.

Each layer 200-240 can be made square shaped (or otherwise shaped) with one or more square, or otherwise, shaped cutouts to enable placement of a component, transmission of electrons, or other function. Components 260-290 may include discrete elements like lenses, deflectors, blankers, etc., or assemblies of elements such as fabricated lens or deflector stacks. Layers can vary in thickness, for example from 3.7 to 8.2 mils for LTCC and significantly more for HTCC and polyimide processes. Each layer 200-240 can have the same thickness or their thicknesses can vary from each other.

The internal volume of column package 120a has an hourglass shape designed to minimize the overall package size and maximize the real estate available for printed circuitry. The cutouts in each layer 210-230 decreases in at least one dimension from the top layer 200 and the bottom layer 240 to the center layer 220, which allows each component 260-290 access to its' corresponding layer. The minimum dimension of the cutout 250 is determined by the minimum practical size of component 270, the minimum required contact region at each layer, and the number of components.

Technology used for building the column 120 is described in further detail in U.S. Pat. No. 7,109,486 issued Sep. 19, 2006 and incorporated herein by reference.

Figure 3:
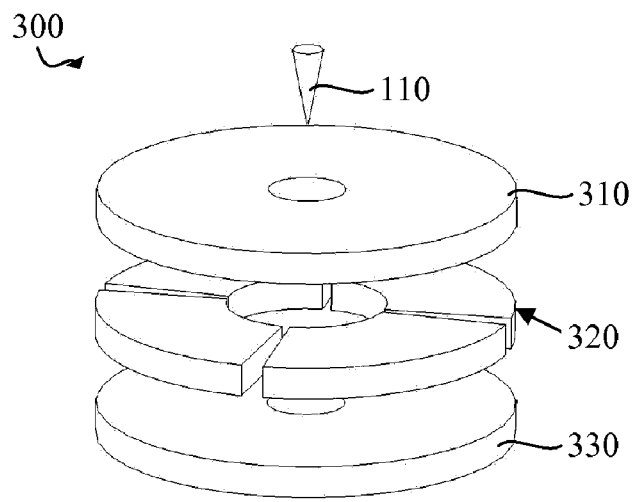
FIG. 3 is a block diagram illustrating a deflector system according to an embodiment of the invention.

FIG. 3 is a block diagram illustrating a deflector system 300 according to an embodiment of the invention. In an embodiment, the system 300 includes an extractor 310, a deflector (e.g., quadrapole)/blanker 320 and a blanking aperture/limiting aperture 330. The source 110 is aligned to the extractor electrode 310 which is further aligned to the beam limiting aperture 330. The deflector/blanker 320 is sandwiched between the extractor 310 and the aperture 330.

The source 110 is fixed in place above the extractor 310 with an external high-precision positioning system, and aligned in-situ with the integrated deflector 320. The deflector 320 corrects for source 110 misalignment by redirecting the charged particle beam through the limiting aperture 330 and down the optical axis. Misalignments occur primarily as a result of heating the source 110 to the standard operating temperature of 1800 K, but can also result from mechanical shifts during installation and pump down. By optimizing the beam at the exit of a final lens, the deflector 320 can also be used to correct for manufacturing errors in the column 120 alignment. More than one deflector can be inserted into the silicon stacks (either above or below the limiting aperture) to allow for multiple deflections which can remove any additional tilt errors. Astigmatism introduced by the deflectors 320 is easily removed by stigmators located further down the column 120. For these functions, only static voltages need be applied to the electrostatic deflectors 320, which are readily generated from simple power supplies.

A second function of the deflectors 320 is to act as primary and/or secondary blankers. If the two sets of poles are activated out of phase, a field is created which can steer the beam completely off the limiting aperture 330 (or blanking aperture in this case), thus extinguishing the beam on the sample. Any leakage from the primary beam can further be deflected across lower apertures to provide a secondary blanking function and thereby achieving a higher extinction ratio. This blanker/alignment geometry can support both conjugate and non-conjugate blanking operational modes. The high speed blanking signal is injected on top of the static deflection signals to provide the full capabilities. Typically, alignment requires ~+/−1V per pole and blanking requires ~+/−5V. Because the miniature electron columns are fabricated from silicon components and RF ceramics, passive as well as active components can be placed very close (~mm) to the deflectors to minimize impedance mismatch, cable capacitance and other parasitic affects and are thus well suited for extremely high speed blanking (up to GHz).

Figure 4:
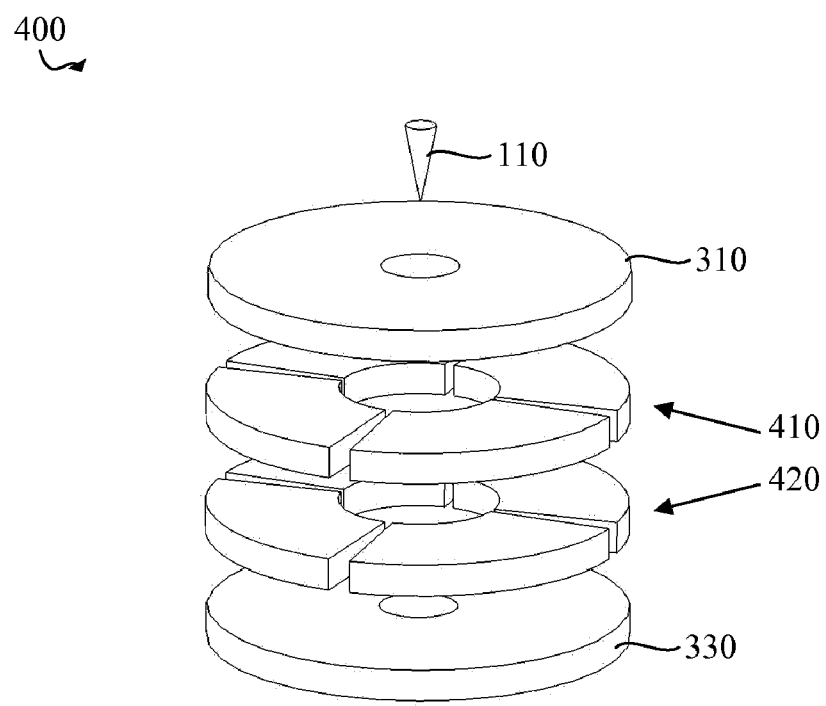
FIG. 4 is a block diagram illustrating a deflector system according to another embodiment of the invention.

FIG. 4 is a block diagram illustrating a deflector system 400 according to another embodiment of the invention. The system 400 includes a plurality of deflectors (e.g., two deflectors: deflectors 410 and 420) sandwiched between the extractor 310 and the aperture 330 for blanking and beam steering. Each deflector 410 and 420 serve to both blank the beams as well as bring the beam back on axis.

FIGS. 5A and 5B are images of a deflector according to an embodiment of the invention. The deflector/blanker is installed in the charged particle beam column 120 directly above the limiting aperture 330. The apertures are micromachined from 300 um thick silicon and have extremely good circularity and minimal surface roughness. These components have been installed and tested in numerous single and multi-column configurations.

FIGS. 6A and 6B are images with and without use of a deflector, respectively, of a sample. As installed (after external alignment) the best attainable image, FIG. 6A, at best focus produces a FWHM spot >360 nm. After alignment, spot size is reduce by ~6× resulting in the high resolution image shown in FIG. 6B. In this example, the source is ~17 um off the optical axis defined by the location of the limiting aperture 330.

Figure 7:
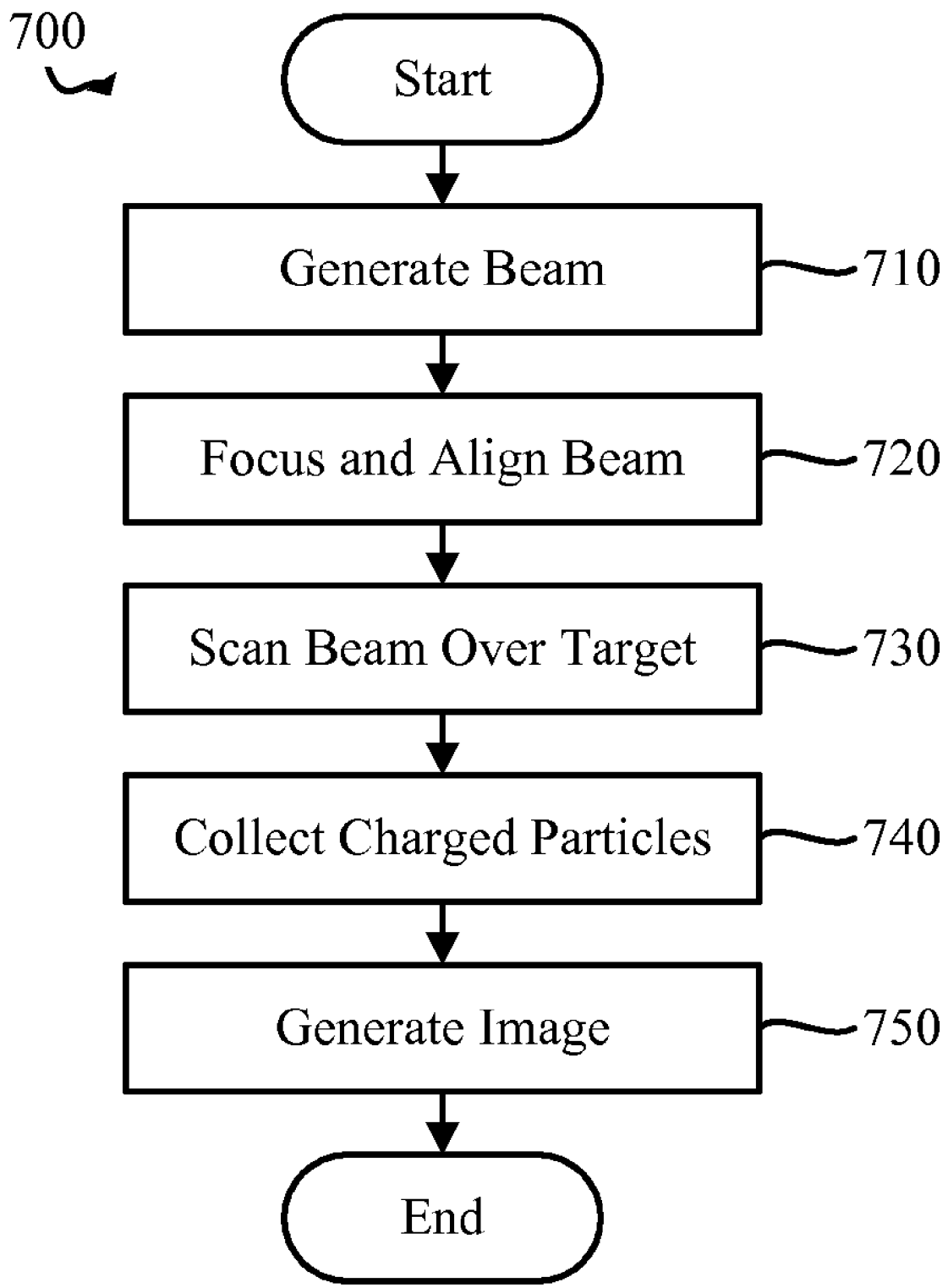
FIG. 7 is a flowchart illustrating a method of using a charged particle column package with a deflector for imaging a sample.

FIG. 7 is a flowchart illustrating a method 700 of using an electron beam column package 120. First a charged particle (e.g., electron) beam is generated (710). The beam is then is focused and aligned (720) using focusing components and the deflector 320 coupled to beam column package 120. The amount of deflection (alignment) can be calibrated based on feedback from a generated (750) image or from current from the column by varying voltage to the deflector 320. This calibration can be done at every imaging session or at regular intervals. The calibration can be done manually or automatically. The beam is then scanned (730) over a target, also using components, e.g., a dual octupole, in the column package 120. The scanned beam impacts the target, generating backscattered and secondary electrons (and/or photons), which are collected (740) by a detector. An imaging device then generates (750) an image based on the collected electrons. The method 700 then ends. When the target includes a resist-coated wafer, the scanning (730) can cause the printing of a pattern onto the wafer for electronic circuits or other high-resolution devices.

The foregoing description of the illustrated embodiments of the present invention is by way of example only, and other variations and modifications of the above-described embodiments and methods are possible in light of the foregoing teaching. The embodiments described herein are not intended to be exhaustive or limiting. The present invention is limited only by the following claims.

What is claimed is:

1. A charged particle beam column package, comprising:
   an assembly of layers comprising at least one deflector sandwiched between a limiting aperture and an extractor; and
   at least one controlled impedance line coupled to the deflector.

2. The beam column package of claim 1, wherein the layers are made from ceramic.

3. The beam column package of claim 2, wherein the layers are made from HTCC.

4. The beam column package of claim 1, wherein the deflector includes a multipole deflector.

5. The beam column package of claim 1, wherein the deflector comprises two or more sets of poles and wherein the sets of poles are activated in-phase or out-of-phase, thereby blanking, tilting or shifting the beam with respect to the optic axis of the column.

6. The beam column package of claim 1, wherein the deflector is positioned directly beneath the extractor.

7. The package of claim 1, wherein the deflector, limiting aperture layer and extractor form a single component.

8. A scanning charged particle microscope, comprising:
   an assembly of layers comprising at least one deflector sandwiched between a limiting aperture and an extractor;
   an electron source adjacent to the assembly;
   at least one controlled impedance line coupled to the deflector; and
   a sample holder adjacent to the assembly.

9. A method, comprising:
   generating a charged particle beam;
   focusing the beam with a charged particle beam column package, the beam column package having an assembly of layers, the layers comprising at least one deflector sandwiched between a limiting aperture and an extractor;
   aligning the beam using the at least one deflector;
   scanning the beam over a target with a component other than the deflector; and
   controlling the deflector using at least one controlled impedance line.

10. The method of claim 9, wherein the layers are made from ceramic.

11. The method of claim 10, wherein the layers are made from HTCC.

12. The method of claim 10, wherein the deflector includes a multipole deflector.

13. The method of claim 10, wherein the deflector comprises two or more sets of poles and wherein the method further comprises activating the sets of poles in-phase or out-of-phase, thereby blanking, tilting or shifting the beam with respect to the optical axis of the column.

14. The method of claim 10, wherein the deflector is positioned directly beneath the extractor.

15. A charged particle beam column package, comprising:
   an assembly of layers comprising at least one deflector sandwiched between a limiting aperture and an extractor; and
   wherein the deflector includes at least one termination pad.

16. A method, comprising:
   generating a charged particle beam;
   focusing the beam with a charged particle beam column package, the beam column package having an assembly of layers, the layers comprising at least one deflector sandwiched between a limiting aperture and an extractor, the deflector comprising at least one termination pad;
   aligning the beam using the at least one deflector; and
   scanning the beam over a target with a component other than the deflector.

* * * * *

UNITED STATES PATENT AND TRADEMARK OFFICE
CERTIFICATE OF CORRECTION

| | | Page 1 of 1 |
|---|---|---|
| PATENT NO. | : 8,003,952 B2 | |
| APPLICATION NO. | : 11/848226 | |
| DATED | : August 23, 2011 | |
| INVENTOR(S) | : Lawrence P. Muray et al. | |

It is certified that error appears in the above-identified patent and that said Letters Patent is hereby corrected as shown below:

In column 7, line 43, in Claim 7, after "aperture" delete "layer".

Signed and Sealed this
Eighteenth Day of October, 2011

David J. Kappos
*Director of the United States Patent and Trademark Office*